United States Patent
Burgdorf et al.

(10) Patent No.: US 6,437,993 B1
(45) Date of Patent: Aug. 20, 2002

(54) SHIELDED HOUSING FOR ELECTRONIC CIRCUIT OR COMPONENTS

(75) Inventors: Jochen Burgdorf, Offenbach; Heinz Loreck, Idstein; Carsten Merz, Ingelheim; Uwe Schwetlick, Frankfurt am Main, all of (DE)

(73) Assignee: Continental Teves AG & Co., oHG, Frankfurt (DE)

( * ) Notice: Subject to any disclaimer, the term of this patent is extended or adjusted under 35 U.S.C. 154(b) by 0 days.

(21) Appl. No.: 09/646,598
(22) PCT Filed: Mar. 15, 1999
(86) PCT No.: PCT/EP99/01675

§ 371 (c)(1),
(2), (4) Date: Feb. 2, 2001

(87) PCT Pub. No.: WO99/48173

PCT Pub. Date: Sep. 23, 1999

(51) Int. Cl.$^7$ .................................................. H05K 9/00
(52) U.S. Cl. ................... 361/818; 361/800; 361/816; 361/752; 333/186; 439/492; 439/497; 439/499; 439/607; 439/610
(58) Field of Search ........................... 361/800, 816, 361/752, 753, 796; 333/186, 181; 439/492, 497, 499, 607, 610

(56) References Cited

U.S. PATENT DOCUMENTS

| 5,167,539 A | 12/1992 | Okamoto et al. |
| 5,248,266 A | 9/1993 | Clyatt et al. |
| 5,362,243 A * | 11/1994 | Huss et al. ................ 439/76 |
| 5,504,659 A * | 4/1996 | Acatay et al. ............. 361/816 |

FOREIGN PATENT DOCUMENTS

| DE | 20 22 318 | 11/1971 |
| DE | 38 08 330 | 9/1989 |
| GB | 2 184 293 | 6/1987 |
| JP | 06 290993 | 10/1994 |

* cited by examiner

*Primary Examiner*—David Martin
*Assistant Examiner*—Thanh Y. Tran
(74) *Attorney, Agent, or Firm*—Rader, Fishman & Grauer PLLC

(57) ABSTRACT

A shielded housing for accommodating electronic circuits or components which are sensitive to electromagnetic interference fields or radiate interference fields, is fitted with an electrical connection in the form of a connecting cable, connecting plug or the like. This housing includes a shielding in the form of a closed metallic coating (of a conductive material) and, moreover, includes filter devices which are active against interference fields in particular in the area where the connection enters or penetrates the housing. In accordance with this invention, at least in the area of entry or lead-in, filter devices with capacitors are provided which are embodied as integral components of the connecting elements and of the shielding and, possibly, of the housing walls, also.

20 Claims, 1 Drawing Sheet

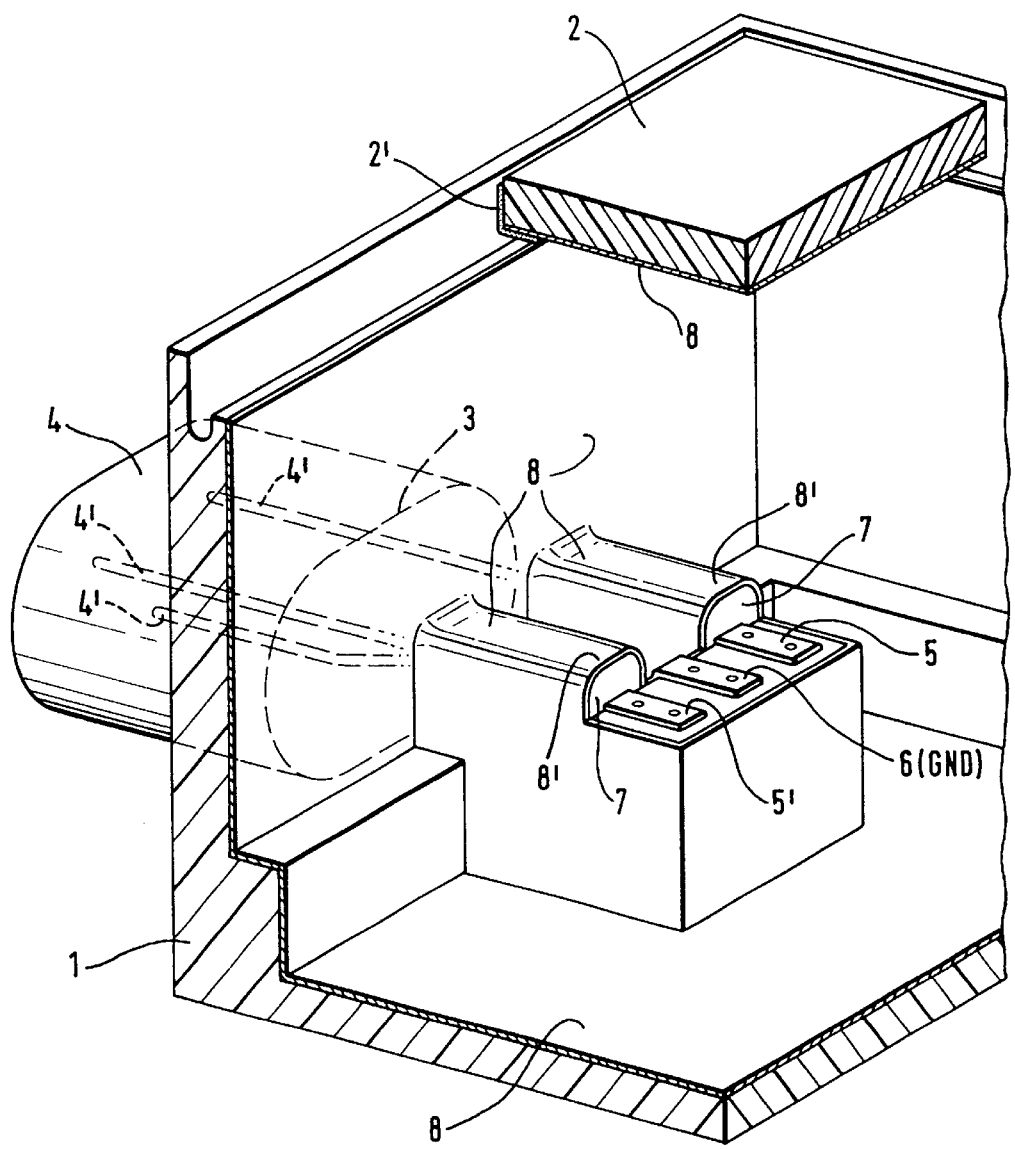

SHIELDED HOUSING FOR ELECTRONIC CIRCUIT OR COMPONENTS

TECHNICAL FIELD

This invention generally relates to electromagnetic shielding and more particularly relates to a shielded housing for accommodating electronic circuits and/or components which are sensitive to electromagnetic interference fields and/or radiate interference fields.

BACKGROUND OF THE INVENTION

Usually electronic circuits, sensitive to irradiated high-frequency electromagnetic fields, are accommodated in shielded housings. The shield protects the circuitry against the direct incidence of the high-frequency fields. The electric fields, however, may also reach the circuitry indirectly via electric cables, leading into the housing, and cause electrical interference with the circuitry. Therefore, filter devices which are active against high frequencies are provided at the point where the cable enters the housing. These filter devices are usually discrete feed-through filters or feed-through capacitors, respectively.

The above-described arrangement may also be used with circuits, emitting high-frequency electromagnetic fields, so as to protect the environment against the emission of fields.

Such shielded housings usually are made from metal and the feed-through capacitors are soldered, screwed or pressed in. A noise-suppressing plug is described in U.S. Pat. No. 5,167,539. The walls of the plug receptacle are of metal.

For various reasons (such as cost, weight, elasticity) often plastic housings are used. So as to achieve the desired shielding effect these housings are metallized. The electric connection between feed-through capacitor and metallization often cannot be achieved by simple means.

It is thus an object of this invention to develop a housing of the type referred to at the beginning which is characterized by a simple design, low manufacturing expense and by a high filtering effect, in particular in the area of entry of the cables leading into the housing.

The present invention fulfills the objects of the invention in the area of entry or lead-in, filter devices with capacitors are provided which are embodied as integral components of the connecting elements and of the shield.

This invention renders the use of discrete and constructionally expensive feed-through capacitors superfluous. Instead, the structures in the area of the points of penetration which consist of the electrically conductive connections leading into the housing (such as plug pins and punched grids, injection-moulded into the housing, and other inserts), of the insulating layers (dielectrics) and of the shield serve as feed-through capacitors.

The dielectric may be applied to the conductive connection either out of the housing material during the manufacture of the housing (e.g., plastic injection-moulding processes) or by means of a further operation such as by lacquering, laminating, imprinting, etc.

The second capacitor plate is applied in one operation with the shielding, e.g., by means of electroplating, sputtering or lacquering.

The capacity of the feed-through capacitor constructed in accordance with this invention may be calculated as follows:
Two-plate capacitor:

$$C = \in \cdot A/s;$$

$$\in = \in_0 \cdot \in_r, \in_0 = 8.85 \cdot 10^{-12} \text{ F/m}$$

Cylinder capacitor:

$$C = 2\pi \cdot \in \cdot 1/\ln(r_2/r_1)$$

The impedance can be calculated as follows:

$$X_c = 1/(2\pi \cdot f \cdot C)$$

The lower the frequency to be filtered, the greater the required capacity of the feed-through capacitor. A great capacity of the feed-through capacitor is achieved by means of large surfaces A and a small distance s of the capacitor plates.

The following advantages are achieved, with the following disadvantages eliminated:
 elimination of the discrete feed-through capacitors and of all the production steps for their assembly;
 the feed-through capacitors are manufactured without any additional operation, e.g., in but one cost-saving cycle of operation.

In the following, special examples of embodiments of this invention and their modes of operation will be described:
Two-plate capacitor:

$$C = \in \cdot A/s;$$

$\in_r=4.2$; A=2.5 mm·7.5 mm; s=10 µm (lacquered)
C=70 pF
$X_c=1/(2\pi \cdot 1.8 \text{ GHz} \cdot 70 \text{ pF})=1.3 \ \Omega$
$X_c=1/(2\pi \cdot 26 \text{ MHz} \cdot 70 \text{ pF})=87 \ \Omega$
$\in_r=4.2$; A=2.5 mm·7.5 mm;
s=0.3 mm (plastic, injection-moulded)
C=2.3 pF
$X_c=1/(2\pi \cdot 1.8 \text{ GHz} \cdot 2.3 \text{ pF})=38 \Omega$
Cylinder capacitor:

$$C=2\pi \cdot \in \cdot 1/\ln(r_2/r_1); \ 1=3 \text{ mm}$$

$\in_r=4.2$; $r_1=0.5$ mm; $r_2=0.501$ mm
C=350 pF
$X_c=1/(2\pi \cdot 1.8 \text{ GHz} \cdot 350 \text{ pF})=250 \text{ m}\Omega$
$X_c=1/(2\pi \cdot 1.8 \text{ GHz} \cdot 350 \text{ pF})=17.5 \ \Omega$
The following variants of this invention are conceivable:
 a combination of this invention with technologies already applied for representing conductor structures on plastic housings;
 a special moulding of the capacitor plates for the manufacture of filter structures (e.g., T or pi filters) by using, e.g., the strip line technology.

BRIEF DESCRIPTION OF THE DRAWINGS

The accompanying FIG. 1 is the perspective, schematically simplified and partial representation of one embodiment of the present invention. The housing 1,2 is a section cut open so as to illustrate the embodiment of the point of penetration which also serves as capacitors.

DETAILED DESCRIPTION OF THE PREFERRED EMBODIMENTS

The housing of this representation consists of a hollow body 1, shaped like a rectangular prism, for accommodating a (non-illustrated) electronic circuit, of a sensor or the like which is sensitive to spurious radiation, and is closed by a lid 2 represented but in part. Hollow body 1 and lid 2 comprise an enclosure.

By way of a lead-in 3 and a (non-illustrated) multi-conductor connection cable, the housing, i.e., the electronics inside the housing, is connected with the related external circuitry, power supply etc.

Referring to the represented example of an embodiment, a plug receptacle 4 is arranged in the area of the lead-in 3 symbolized by an edge represented by a broken line. Strictly speaking, the lead-in 3 of this embodiment is expanded to be a receptacle 4 accommodating the (non-illustrated) plug of a connecting cable. Three elements 4' (i.e. points of penetration) for accommodating the plug contact are outlined inside the receptacle 4. The elements 4' may be designed to accommodate plug pins, punched grids, lugs, or other inserts injection-moulded into the housing.

Housing 1, 2 of the present example of an embodiment of this invention consists of plastic which, on the inside of the housing, is provided with an electrically internal conductive layer 8 serving as shielding.

What is essential in terms of invention is the embodiment of the lead-in 3 or rather of the area of entry or penetration (4') of the electrical connection. This connection is a three-conductor connection. The individual connecting elements (not shown), are fed through the elements 4' of the housing 1, 2, which are connected to three pins or plates 5, 5', 6. Hereinafter, elements 5, 5', and 6 are referred to as connecting pins 5, 5', 6. The connecting pin 6 in the middle serves to connect the ground GND, the two outer connector pins 5, 5', serve to connect the signal feed and the power supply, respectively.

Provided on the connector pins 5, 5' is a layer serving as dielectric 7 and, in this case, consisting of the material of the housing 1, 2. This dielectric 7 carries a capacitor plate layer 8' of an electrically conductive material conductively connected with the metallization or internal conductive layer 8 of housing 1, namely with the shield. In accordance with this invention, this capacitor plate layer 8' can be manufactured as direct integral component of the shield or internal conductive layer 8. It is evident that, in this way, capacitors or feed-through capacitors are simulated by the structural combination of the connector pins 5, 5', the dielectric 7, and the capacitor plate layer 8'. The structural simulation of a capacitor or feed-through capacitor can be manufactured very easily and in a cost-saving manner. No separate manufacturing steps are required for applying the dielectric 7 and the capacitor plates layer 8'. This will rather take place simultaneously with injection-moulding and coating the walls of the housing.

After inserting the (non-represented) electronics in the internal space and after connecting the electronics, the inventive housing is closed by the lid 2 which is mounted and glued in. Preferably a conductive glue 2' is used so as to realize a completely closed shielding.

What is claimed is:

1. A shielded housing for accommodating electronic components that are sensitive to electromagnetic fields or that radiate electromagnetic fields, comprising:
   an enclosure, wherein the walls of the enclosure are made of plastic;
   an electrical connection connected to said enclosure, said electrical connection in the form of a receptacle having a plurality of receptacle elements to allow a point of penetration for a connecting cable at a lead-in portion of the enclosure;
   a shield in the form of a coating applied to the inner walls of the enclosure, said coating including a conductive material; and
   a filter device which is active against electromagnetic fields at the point of penetration area where the connecting cable enters or penetrates the enclosure, the filter device defined as an integral component of the electrical connection and of the shield.

2. A shielded housing as claimed in claim 1, wherein the receptacle elements may be further defined in a specific shape to accommodate at least one plug pin, punched grids, or lugs that may be inserted into the enclosure at the point of penetration, wherein the receptacle and receptacle elements are injection-moulded onto the enclosure at the lead-in portion.

3. A shielded housing as claimed in claim 1, wherein said capacitor plate layer of said filter device is applied in the same operation with applying the shielding to the walls of the enclosure.

4. A shielded housing as claimed in claim 3, wherein the capacitor plate layer is applied to the shield by electroplating, sputtering, or lacquering.

5. A shielded housing as claimed in claim 1, wherein the filter device further comprises a dielectric, connecting pins, and a capacitor plate layer.

6. A shielded housing as claimed in claim 5, wherein the filter device acts as a feed-through capacitor.

7. A shielded housing as claimed in claim 5, wherein the dielectric is made of the same plastic material as that of the enclosure.

8. A shielded housing as claimed in claim 7, wherein the dielectric is applied to the capacitor plate layer by plastic injection moulding, lacquering, laminating, or imprinting.

9. A shielded housing as claimed in claim 5, wherein the connecting pins are further defined as a signal feed pin, a power supply pin, and a ground pin.

10. A shielded housing as claimed in claim 1, wherein the enclosure is further defined as having a body portion and a lid portion.

11. A shielded housing as claimed in claim 10, wherein the lid portion is connected to the body portion in sealing engagement with a conductive glue.

12. A shielded housing for accommodating electronic components that are sensitive to electromagnetic fields or that radiate electromagnetic fields, comprising:
    an enclosure, wherein the walls of the enclosure are made of plastic;
    an electrical connection connected to said enclosure, said electrical connection in the form of a receptacle having a plurality of receptacle elements to allow a point of penetration for a connecting cable at a lead-in portion of the enclosure;
    a shield in the form of a coating applied to the inner walls of the enclosure, said coating including a conductive material; and
    a feed-through capacitor-like filter which is active against electromagnetic fields at the point of penetration area where the connecting cable enters or penetrates the enclosure, the feed-through capacitor-like filter defined as an integral component of the electrical connection and of the shield.

13. A shielded housing as claimed in claim 12, wherein the receptacle elements may be further defined in a specific shape to accommodate at least one plug pin, punched grids, or lugs that may be inserted into the enclosure at the point of penetration, wherein the receptacle and receptacle elements are injection-moulded onto the enclosure at the lead-in portion.

14. A shielded housing as claimed in claim 12, wherein the feed-through capacitor-like filter further comprises a dielectric, connecting pins, and a capacitor plate layer, wherein the connecting pins are further defined as a signal feed pin, a power supply pin, and a ground pin.

15. A shielded housing as claimed in claim 14, wherein said capacitor plate layer is applied in the same operation with applying the shielding to the walls of the enclosure.

16. A shielded housing as claimed in claim 15, wherein the capacitor plate layer is applied to the shield by electroplating, sputtering, or lacquering.

17. A shielded housing as claimed in claim 14, wherein the dielectric is made of the same plastic material as that of the enclosure.

18. A shielded housing as claimed in claim 17, wherein the dielectric is applied to the capacitor plate layer by plastic injection moulding, lacquering, laminating, or imprinting.

19. A shielded housing as claimed in claim 12, wherein the enclosure is further defined as having a body portion and a lid portion, wherein the lid portion is connected to the body portion in sealing engagement with a conductive glue.

20. A shielded housing for accommodating electronic components that are sensitive to electromagnetic fields or that radiate electromagnetic fields, comprising:

an enclosure, wherein the walls of the enclosure are made of plastic, wherein the enclosure is further defined as having a body portion and a lid portion, wherein the lid portion is connected to the body portion in sealing engagement with a conductive glue;

an electrical connection connected to said enclosure, said electrical connection in the form of a receptacle having a plurality of receptacle elements to allow a point of penetration defined as a three-conductor connection for a connecting cable at a lead-in portion of the enclosure, wherein the receptacle elements may be further defined in a specific shape to accommodate at least one plug pin, punched grids, or lugs that may be inserted into the enclosure at the point of penetration, wherein the receptacle and receptacle elements are injection-moulded onto the enclosure at the lead-in portion;

a shield in the form of a coating applied to the inner walls of the enclosure, said coating including a conductive material; and a feed-through capacitor-like filter which is active against electromagnetic fields at the point of penetration area where the connecting cable enters or penetrates the enclosure, the feed-through capacitor-like filter defined as an integral component of the electrical connection and of the shield, wherein the feed-through capacitor-like filter further comprises:

connecting pins for the three-conductor connection, wherein the connecting pins are further defined as a signal feed pin, a power supply pin, and a ground pin, a capacitor plate layer, wherein said capacitor plate layer is applied in the same operation with applying the shielding to the walls of the enclosure, wherein the capacitor plate layer is applied to the shield by electroplating, sputtering, or lacquering, and a dielectric, wherein the dielectric is made of the same plastic material as that of the enclosure, wherein the dielectric is applied to the capacitor plate layer by plastic injection moulding, lacquering, laminating, or imprinting.

* * * * *